US009766524B2

(12) United States Patent
Lee et al.

(10) Patent No.: US 9,766,524 B2
(45) Date of Patent: Sep. 19, 2017

(54) LIQUID CRYSTAL DISPLAY DEVICE AND METHOD FOR MANUFACTURING SAME

(71) Applicant: Samsung Display Co., Ltd., Yongin-si, Gyeonggi-do (KR)

(72) Inventors: Seung Kyu Lee, Cheonan-si (KR); Sung Jin Mun, Seongnam-si (KR); Hyun Jae Yoo, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/242,307

(22) Filed: Aug. 19, 2016

(65) Prior Publication Data

US 2017/0059955 A1    Mar. 2, 2017

(30) Foreign Application Priority Data

Aug. 25, 2015 (KR) ......................... 10-2015-0119413

(51) Int. Cl.
*H01L 27/12* (2006.01)
*G02F 1/1362* (2006.01)
*H01L 27/15* (2006.01)

(52) U.S. Cl.
CPC ...... *G02F 1/136286* (2013.01); *H01L 27/124* (2013.01); *H01L 27/1288* (2013.01); *H01L 27/15* (2013.01); *G02F 2001/136295* (2013.01)

(58) Field of Classification Search
CPC .... H01L 27/124; H01L 27/15; H01L 27/1288
See application file for complete search history.

(56) References Cited

U.S. PATENT DOCUMENTS 7,833,075 B2    11/2010   Oh et al.

FOREIGN PATENT DOCUMENTS

| KR | 10-0635564 B1   | 10/2006 |
|----|-----------------|---------|
| KR | 10-2006-0125137 A | 12/2006 |
| KR | 10-2008-0078164 A | 8/2008 |

*Primary Examiner* — Amar Movva
(74) *Attorney, Agent, or Firm* — Innovation Counsel LLP (57) ABSTRACT

Provided are a liquid crystal display and a method of manufacturing a liquid crystal display. According to an aspect of the present inventive concept, there is provided a liquid crystal display which includes a first substrate which includes a display area and a non-display area, and a plurality of data fan-out lines which is disposed in the non-display area and includes a first conductive line extending toward the display area, and a second conductive line extending to overlap the first conductive line. At least a portion of the second conductive line includes a first wiring section extending in a direction parallel to an x-axis, and a second wiring section extending in a direction parallel to a y-axis. In the first wiring section, an upper surface of the second conductive line includes an inclined surface which slopes upward toward a negative direction of the y-axis.

13 Claims, 8 Drawing Sheets

Drawings

LIQUID CRYSTAL DISPLAY DEVICE AND METHOD FOR MANUFACTURING SAME

This application claims priority to Korean Patent Application No. 10-2015-0119413 filed on Aug. 25, 2015 in the Korean Intellectual Property Office, the disclosure of which is incorporated herein by reference in its entirety.

BACKGROUND INVENTIVE CONCEPT

1. Field Inventive Concept

The present inventive concept relates to a liquid crystal display device and a method of manufacturing the same.

2. Description of the Related Art

The importance of a display device has increased along with the development of multimedia. In response to this, various types of display devices, such as a liquid crystal display (LCD) device and an organic light emitting display (OLED) device, are being used.

Among them, the liquid crystal display device is one of flat panel display devices that are most widely used at present, and includes two substrates formed with field generating electrodes such as a pixel electrode and a common electrode, and a liquid crystal layer interposed therebetween. The liquid crystal display device generates an electric field in the liquid crystal layer by applying a voltage to the field generating electrode, determines the direction of the liquid crystal molecules in the liquid crystal layer, and displays an image by controlling the polarization of incident light.

The general liquid crystal display device includes an array substrate, an upper substrate facing the array substrate, and a liquid crystal layer interposed between the upper substrate and the array substrate.

In a display area of the array substrate, a plurality of gate lines, and a plurality of data lines intersecting with the plurality of gate lines while being insulated are provided. In a non-display area of the array substrate, a gate drive unit which outputs a gate signal, and a data drive unit that outputs a data signal are disposed.

A plurality of gate fan-out lines is provided between the gate drive unit and the plurality of gate lines. A plurality of gate fan-out lines provides the gate signal output from the gate drive unit to the plurality of gate lines.

Meanwhile, a plurality of data fan-out lines is further provided between the data drive unit and the plurality of data lines. The plurality of data fan-out lines transmits the data signals output from the data drive unit to the plurality of data lines.

In general, the wiring intervals of a plurality of gate and data fan-out lines at portions adjacent to each of the gate drive unit and the data drive unit are narrower than the wiring intervals of the plurality of gate lines and the plurality of data lines. Therefore, a plurality of gate and data fan-out lines is partially bent, and the length deviation and the resistance deviation between the fan-out lines occur. To prevent this, it is possible to achieve a structure in which the gate and data fan-out lines located at the center portions of the gate drive unit and the data drive unit are at least partially bent.

Recently, products in which the number of pixels and the number of the channels of the drive unit increase, and meanwhile, the size of the non-display area is reduced are being developed. Thus, it is difficult to reduce the length deviation and the resistance deviation between the fan-out lines.

SUMMARY INVENTIVE CONCEPT

An aspect of the present inventive concept provides a liquid crystal display device capable of improving display quality by reducing the resistance deviations between the fan-out lines.

Another object of the present inventive concept provides a liquid crystal display device in which the variation of each component is uniform by reducing the physical resistance due to bending caused by the plurality of fan-out lines.

However, aspects of the present inventive concept are not restricted to those set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a liquid crystal display which includes a first substrate which includes a display area and a non-display area surrounding the display area, and a plurality of data fan-out lines which is disposed in the non-display area, the plurality of data fan-out lines including a first conductive line, and a second conductive line which overlaps the first conductive line. At least a portion of the second conductive line includes a first wiring section extending in a first direction, and a second wiring section extending in a direction substantially perpendicular to the first direction. An upper surface of the second conductive line includes an inclined surface which slopes upward toward an opposite direction of the first direction. The liquid crystal display device may further comprise a gate insulating film which is disposed on the first conductive line to insulate the first conductive line and the second conductive line.

A central portion of the data fan-out line may includes a double wiring structure which includes the first conductive line and the second conductive line, and both ends of the data fan-out line includes a single wiring structure having the first conductive line or the second conductive line.

The data fan-out line is connected to a data line may disposed in the display area, and one end of the data fan-out line connected to the data line includes of only the second conductive line.

The other end of the data fan-out line may only include the first conductive line.

The inclined surface may be formed only on the first wiring section which is nearest to the side of the first substrate parallel to the first wiring section.

The data fan-out line may comprise a contact which electrically connects the first conductive line and the second conductive line.

The liquid crystal display device may further comprise a first gate insulating film disposed on the conductive line, and a passivation film disposed on the second conductive line, wherein the contact comprises a first sub-contact hole which exposes the first conductive line through the passivation film and the gate insulating film, and a second sub-contact hole which exposes the second conductive line through the passivation film.

The contact further may comprise a first connection electrode which electrically connects the first conductive line and the second conductive line through the first sub-contact hole and the second sub-contact hole.

The contact may comprise a first contact adjacent to one side of the first substrate, and a second contact adjacent to one side of the display area.

The second contact may comprise two second sub-contact holes and one first sub-contact hole.

The inclined surface comprises at least two flights of stairs.

The second conductive line has a multi-film structure having a plurality of layers.

The liquid crystal display device may further comprise a gate line disposed on the display area, wherein the gate line extends in the first direction.

According to another aspect of the present inventive concept, there is provided a method of manufacturing a liquid crystal display which includes preparing a first substrate which includes preparing a first substrate which includes a first conductive line, a gate insulating film disposed on the first conductive line, a semiconductor pattern layer disposed on the gate insulating film, and a second conductive layer disposed on the semiconductor pattern layer, forming a first photosensitive film pattern having a first height on the second conductive layer, forming a second conductive line by etching the second conductive layer using the first photosensitive film pattern as a mask; forming a second photosensitive film pattern which exposes a portion of the second conductive line and has a second height by removing a portion of the first photosensitive film layer pattern, forming a first stepped portion on the second conductive line by etching a portion of the second conductive line using the second photosensitive film pattern as a mask; forming a third photosensitive film pattern which exposes a portion of the second conductive line and has a third height, by removing a portion of the second photosensitive film pattern, and forming a second stepped portion on the second conductive line, by etching a portion of the second conductive line using the third photosensitive film pattern as a mask.

Forming the first stepped portion on the second conductive line by etching a portion of the second conductive line using the second photosensitive film pattern as a mask may comprise dry-etching the second conductive line, using the second photosensitive film pattern as a mask.

The method of manufacturing a liquid crystal display device may further comprise forming a third photosensitive film pattern which exposes a portion of the second conductive line and has a third height, by removing a portion of the second photosensitive film pattern; and forming a second stepped portion on the second conductive line, by etching a portion of the second conductive line using the third photosensitive film pattern as a mask.

Forming the second stepped portion on the second conductive line by etching a portion of the second conductive line using the third photosensitive film pattern as a mask may comprise dry-etching the second conductive line.

An upper surface of the first photosensitive film pattern may comprise an inclined surface.

According to the embodiments of the present inventive concept, there are at least the following effects.

That is, it is possible to improve the display quality by reducing the resistance deviations between the fan-out lines.

Also, it is possible to provide a liquid crystal display device in which the variation of each component is uniform, by reducing the physical resistance due to the bending caused by the plurality of fan-out lines.

The effects of the present inventive concept are not limited by those illustrated above, and furthermore various effects are included herein.

BRIEF DESCRIPTION OF THE DRAWINGS

The above and other aspects and features of the present inventive concept will become more apparent by describing in detail exemplary embodiments thereof with reference to the attached drawings, in which:

FIG. 10 is a cross-sectional view for explaining a method of manufacturing a liquid crystal display device according to an embodiment of the present inventive concept;

FIG. 11 is a cross-sectional view for explaining a method of manufacturing a liquid crystal display device according to an embodiment of the present inventive concept;

FIG. 12 is a cross-sectional view for explaining a method of manufacturing a liquid crystal display device according to an embodiment of the present inventive concept;

FIG. 13 is a cross-sectional view for explaining a method of manufacturing a liquid crystal display device according to an embodiment of the present inventive concept;

FIG. 14 is a cross-sectional view for explaining a method of manufacturing a liquid crystal display device according to an embodiment of the present inventive concept;

FIG. 15 is a cross-sectional view for explaining a method of manufacturing a liquid crystal display device according to an embodiment of the present inventive concept; and FIG. 16 is a cross-sectional view for explaining a method of manufacturing a liquid crystal display device according to an embodiment of the present inventive concept.

DETAILED DESCRIPTION OF THE INVENTIVE CONCEPT

The aspects and features of the present inventive concept and methods for achieving the aspects and features will be apparent by referring to the embodiments to be described in detail with reference to the accompanying drawings. However, the present inventive concept is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the inventive concept, and the present inventive concept is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the present inventive concept, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, embodiments of the present inventive concept will be described with reference to the attached drawings.

Figure 1:
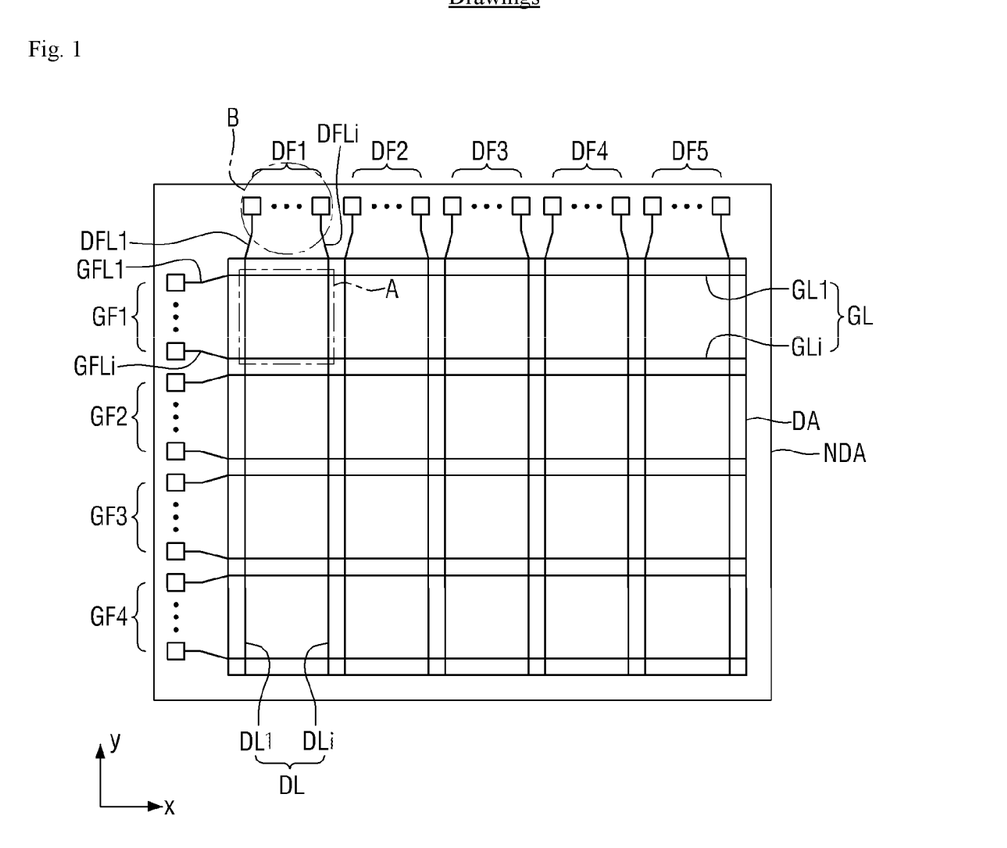
FIG. 1 is a plan view of a liquid crystal display device according to an embodiment of the present inventive concept.
Figure 2:
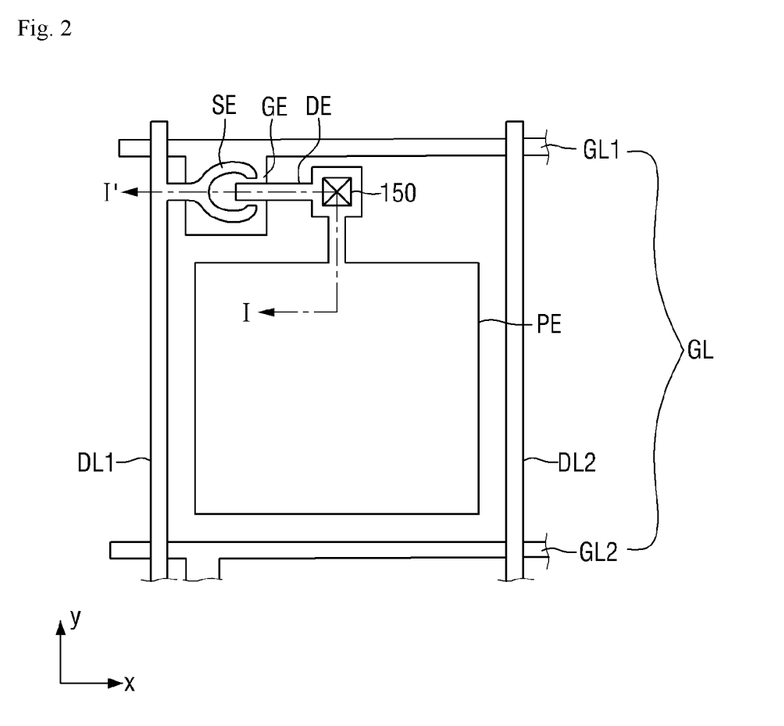
FIG. 2 is an enlarged view of an area 'A' of FIG. 1.
Figure 3:
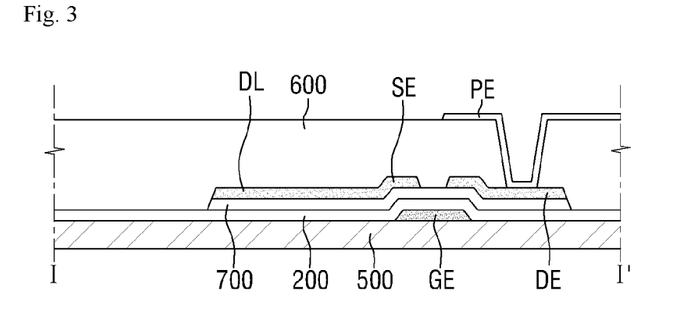
FIG. 3 is a cross-sectional view taken along the line I-I of FIG. 2.

FIG. 1 is a plan view of a liquid crystal display device according to an embodiment of the present inventive concept. FIG. 2 is an enlarged view of an area 'A' of FIG. 1. FIG. 3 is a cross-sectional view taken along the line I-I' of FIG. 2.

Referring to FIGS. 1 to 5, a liquid crystal display according to an embodiment of the present inventive concept includes a first substrate 500 which includes a display area DA and a non-display area NDA, and a plurality of data fan-out lines DFL1 to DFLi which is disposed in the non-display area NDA and includes a first conductive line EL1 extending toward the display area DA, and a second conductive line EL2 extending to overlap the first conductive line EL1. At least a portion of the second conductive line EL2 includes a first wiring section w1 extending in a direction parallel to an x-axis, and a second wiring section w2 extending in a direction parallel to a y-axis. In the first wiring section w1, an upper surface of the second conductive line EL2 includes an inclined surface which slopes upward toward a negative direction of the y-axis.

The first substrate 500 may be formed of a material having heat resistance and permeability. The first substrate 500, for example, may be formed of transparent glass or plastic, but the present inventive concept is not limited thereto. The display area DA and the non-display area NDA are defined on the first substrate 500.

The display area DA is an area in which images are displayed on the display device, and the non-display area NDA is an area in which various signal lines are disposed to supply various signals such as gate signals and data signals to the display area DA. The display area DA will be more specifically described with reference to FIG. 2. The display area DA may include a plurality of pixel areas in which a plurality of data lines DL and a plurality of gate lines GL are formed to intersect with each other. FIG. 2 is an enlargement of a pixel of a plurality of pixel areas, and the display area may include a plurality of pixels substantially identical thereto.

Referring to FIG. 2, gate wirings GL, GE may be disposed on the first substrate 500. The gate wirings GL, GE may include a gate line GL which receives the transmission of the signals required for driving, a gate electrode GE which protrudes from the gate line GL in the form of a protrusion, and a gate end (not illustrated) which is disposed on at least one end of the gate line GL.

The gate line GL may extend in a first direction. The first direction may be substantially the same as an x-axis direction of FIG. 2. The gate electrode GE may constitute three terminals of a thin film transistor with a source electrode SE and a drain electrode DE to be described later.

The gate wirings GL, GE may contain one or more of an aluminum (Al)-based metal including aluminum alloy, a silver (Ag)-based metal including silver alloy, a copper (Cu)-based metal containing copper alloy, a molybdenum (Mo) based metal including molybdenum alloy, chromium (Cr), titanium (Ti) and tantalum (Ta). However, they are examples and the materials of the gate wirings GL, GE are not limited thereto. Metal or polymeric material having a performance required to achieve the desired display device may be used as the material of the gate wirings GL, GE.

The gate wirings GL, GE may be, but not limited to, a single film structure, and they may be a double film, a triple film or a multi-film.

A gate insulating film 200 may be disposed on the gate wirings GL, GE. The gate insulating film 200 may cover the gate wirings GL, GE and may be formed over the entire surface of the first substrate 500.

The gate insulation film 200 may be formed by one or more materials selected from the group consisting of an inorganic insulating material such as silicon oxide (SiOx) and silicon oxide (SiNx), and an organic insulating material such as benzocyclobutene (BCB), an acryl-based material and polyimide. However, this is an example, and the material of the gate insulating film 200 is not limited thereto.

A semiconductor pattern layer 700 may be disposed on the gate insulating film 200.

The semiconductor pattern layer 700 may contain amorphous silicon or polycrystalline silicon. However, it is not limited thereto, and the semiconductor pattern layer 700 may also be formed to contain an oxide semiconductor.

The semiconductor pattern layer 700 may have various shapes such as an island shape and a linear shape. When the semiconductor pattern layer 700 has a linear shape, the semiconductor pattern layer 700 may be disposed below the data line DL and may extend to the top of the gate electrode GE.

In the exemplary embodiment, the semiconductor pattern layer 700 may be patterned substantially in the same shape as data wirings DL, SE, DE, 150 to be described later in areas except the channel region. In other words, the semiconductor pattern layer 700 may be disposed to overlap the data wirings DL, SE, DE, 150 in the entire areas except the channel region. The channel region may be disposed between the source electrode SE and the drain electrode DE facing each other. The channel region serves to electrically connect the source electrode SE and the drain electrode DE, and its specific shape is not limited.

An ohmic contact layer (not illustrated) doped with an n-type impurity at a high concentration may be disposed above the semiconductor pattern layer 700. The ohmic contact layer may overlap all or a portion of the semiconductor pattern layer 700. However, the ohmic contact layer may be omitted in an exemplary embodiment in which the semiconductor pattern layer 700 includes an oxide semiconductor.

The data wirings DL, SE, DE, 150 may be disposed on the semiconductor pattern layer 700. The data wirings DL, SE, DE, 150 may include a data line DL which extends in a second direction, e.g., an y-axis direction in FIG. 2 to intersect with the gate line GL, a source electrode SE which branches from the data line DL and extends to the top of the semiconductor pattern layer 700, a drain electrode DE which is spaced apart from the source electrode SE and is disposed to face the source electrode SE at the top of the semiconductor pattern layer 700, and a drain electrode extension 150 which extends from the drain electrode DE and is electrically connected to a pixel electrode PE to be described later. The drain electrode extension 150 has a relatively wide width as compared to the drain electrode DE, and may further facilitate the electrical contact with the pixel electrode PE.

The data wirings DL, SE, DE, 150 may have a single film or multi-film structure made of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se) tantalum (Ta) or the like. Moreover, it is also possible to apply an alloy which is formed by containing one or more elements selected from the group consisting of titanium (Ti), zirconium (Zr), tungsten (W), tantalum (Ta), niobium (Nb), platinum (Pt), hafnium (Hf), oxygen (O) and nitrogen (N) in the metal. However, the above-described materials are examples, and the materials of the data wirings DL, SE, DE, 150 are not limited thereto.

FIG. 2 illustrates a case where a single thin film transistor is disposed in a pixel, but it is a matter of course that the scope of the present inventive concept is not limited thereto. That is, in another exemplary embodiment, the number of the thin film transistors disposed in a single pixel may be plural.

A passivation film 600 may be disposed over the data wirings DL, SE, DE, 150 and the semiconductor pattern layer 700. The passivation film 600 may include an inorganic insulating material. For example, the passivation film 600 may be formed of silicon oxide, silicon nitride, silicon oxynitride, aluminum oxynitride, titanium oxynitride, zirconium oxynitride, hafnium oxynitride, tantalum oxynitride, tungsten oxynitride or the like. However, they are examples, and the material of the passivation film 600 is not limited thereto.

A contact hole which exposes the passivation film 600 may be formed on the drain electrode extension 150.

A pixel electrode PE may be disposed on the passivation film 600. The pixel electrode PE may be electrically connected to the drain electrode DE through a contact hole formed in the passivation film 600.

In the exemplary embodiment, the pixel electrode PE may be formed of a transparent conductor such as indium tin oxide (ITO) or indium zinc oxide (IZO) or a reflective conductor such as aluminum.

FIG. 2 illustrates a case where the pixel electrode PE has a flat plate shape, but the shape of the pixel electrode is not limited thereto. That is, in another exemplary embodiment, the pixel electrode may be a structure which has one or more slits. In still another exemplary embodiment, one or more pixel electrodes may disposed, and in this case, voltages different from each other may be applied to the plurality of pixel electrodes.

A plurality of data fan-out sections DF1 to DF5 each connected to corresponding data driver (not shown) may be provided in the non-display area DA. FIG. 1 illustrates a case of including the five data fan-out sections DF1 to DF5, but this is an example, and the number of the data fan-out sections may vary depending on the number of the data lines DL1 to DLi or the number of the data drivers 260.

The plurality of fan-out sections DF1 to DF5 may be disposed on one side of the first substrate 500. The plurality of data fan-out sections DF1 to DF5 may transmit the signals required for driving the display device to the data line DL of the display area DA through a data fan-out line DFL to be described later. The first data fan-out section DF1 to the fifth data fan-out section DF5 may have substantially the same configuration. That is, hereinafter, the first data fan-out section DF1 will be described, and the following description may also be similarly applied to the second to fifth data fan-out sections DF2 to DF5.

The first data fan-out section DF1 may include a plurality of data fan-out lines DFL1 to DFLi. Symbol i is a natural number of 1 or more. The plurality of data fan-out lines DFL1 to DFLi may extend towards the display area DA. Also, the respective data fan-out lines are spaced apart from each other and may be sequentially disposed in the x-axis direction. One ends of the data fan-out lines DFL1 to DFLi may be electrically connected to different data lines DL, and in this case, the data signals may be transmitted to the data line DL. For example, the first data fan-out line DFL1 may be connected to the first data line DL1, and the second data fan-out line DFL2 may be connected to the second data line DL2.

Further, the other ends of the data fan-out lines DFL1 to DFLi may be connected to a data driver 210. In this case, the data fan-out lines DFL1 to DFLi may receive the driving signal from the data driver 260 and may transmit it to the data lines DL1 to DLi.

The plurality of data fan-out lines DFL may be described in more detail with reference to FIGS. 4 to 7.

Figure 4:
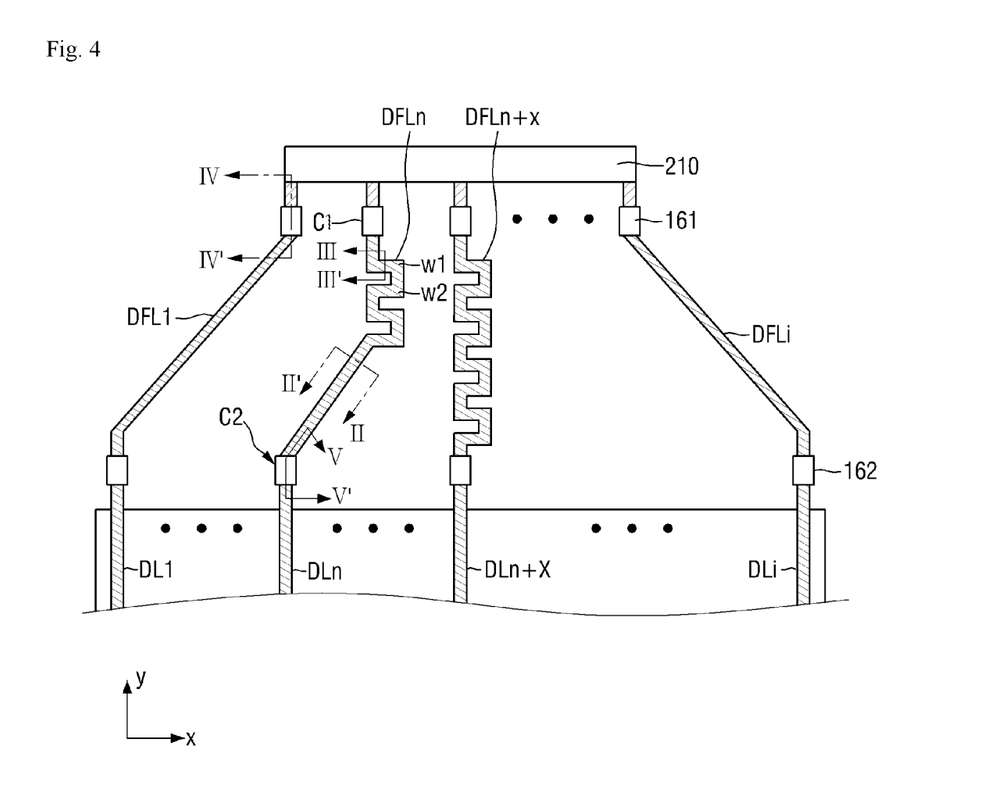
FIG. 4 is an enlarged view of a portion 'B' of FIG. 1.
Figure 5:
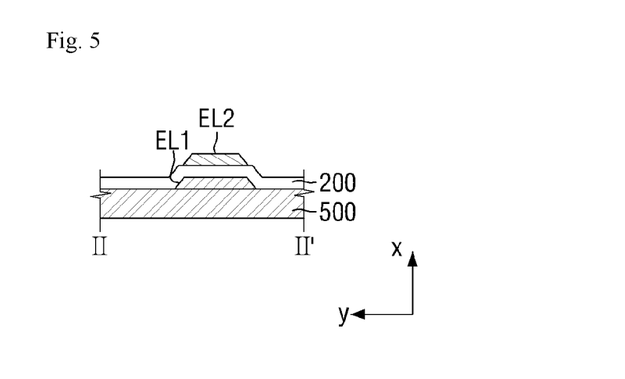
FIG. 5 is a cross-sectional view taken along the line II-II' of FIG. 4.
Figure 6:
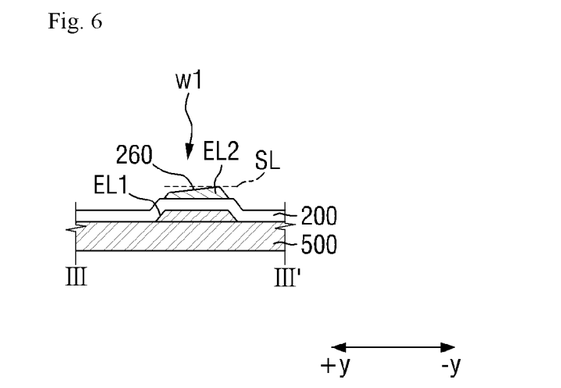
FIG. 6 is a cross-sectional view taken along the line III-III' of FIG. 4.
Figure 7A:
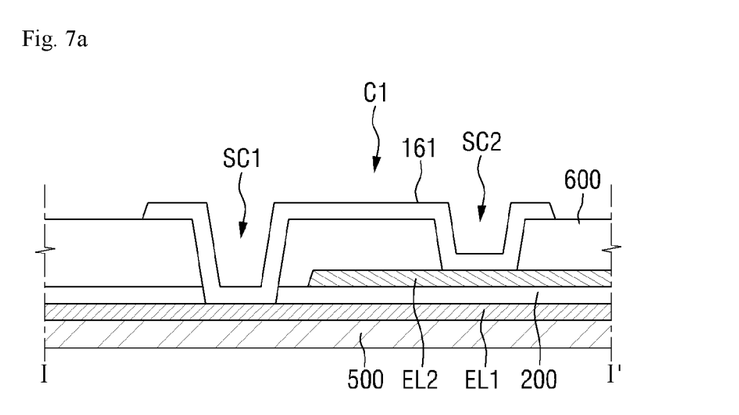
FIG. 7a is a cross-sectional view taken along the line IV-IV' of FIG. 4.
Figure 7B:
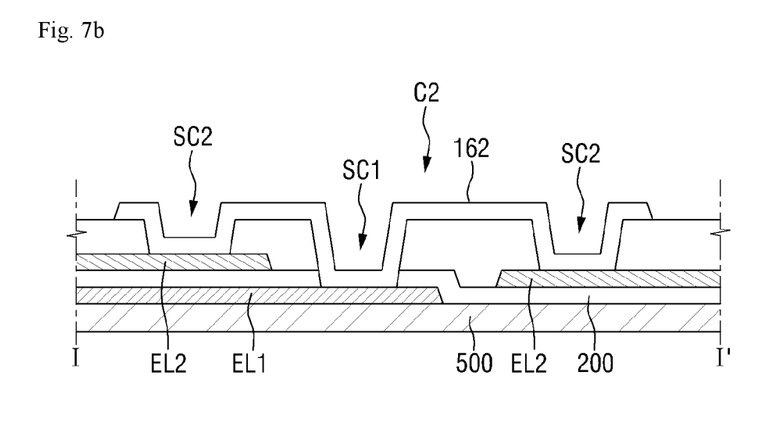
FIG. 7b is a cross-sectional view taken along the line V-V' of FIG. 4.

FIG. 4 is an enlarged view of a portion 'B' of FIG. 1. FIG. 5 is a cross-sectional view taken along the line II-II' of FIG. 4. FIG. 6 is a cross-sectional view taken along the line III-III' of FIG. 4. FIG. 7a is a cross-sectional view taken along the line IV-IV' of FIG. 4. FIG. 7b is a cross-sectional view taken along the line V-V' of FIG. 4.

Referring to FIGS. 4 to 7b, in the liquid crystal display device according to an embodiment of the present inventive concept, the data fan-out line DFL may at least partially have a double wiring structure.

More specifically, the data fan-out line DFL may include a first conductive line EL1 which extends toward the display area DA, and a second conductive line EL2 which extends to overlap the first conductive line EL1.

Referring to FIG. 5, the first conductive line EL1 may be disposed on the first substrate 500. The first conductive line EL1 may be formed of substantially the same material as the gate wirings GL, GE as described above. That is, the first conductive line EL1 may be simultaneously formed on the first substrate 500 during formation of the gate wirings GL, GE. However, it is not limited thereto, and the first conductive line EL1 may be separately formed through a separate process.

The gate insulating film 200 may be disposed on the first conductive line EL1. A second conductive line EL2 may be disposed on the gate insulating film 200 to overlap the first conductive line EL1. The second conductive line EL2 may be formed of substantially the same material as the above-mentioned data wirings DL, SE, DE, 150. That is, the second conductive line EL2 may be simultaneously formed on the first substrate 500 at the time of forming the data lines DL, SE, DE, 150. However, it is not limited thereto, and that the second conductive line EL2 may be separately formed through a separate process.

The width of the second conductive line EL2 may be substantially the same as the width of the first conductive line EL1. However, it is not limited thereto, and in another exemplary embodiment, the width of the second conductive line EL2 may be greater or smaller than the width of the first conductive line EL1.

The second conductive line EL2 may be formed to at least partially overlap the first conductive line EL1. That is, the first conductive line EL1 and the second conductive line EL1 may generally overlap each other, but it is not limited thereto, and only a portion of the second conductive line EL2 may also overlap the first conductive line EL1. As an example, the central portion of the data fan-out line has a double wiring structure made up of the first conductive line EL1 and the second conductive line EL2, but one end and/or the other end of the data fan-out line DFL may have a single wiring structure. Specifically, one end of the data fan-out line DFL connected to the data driver 260 is made up of only the first conductive line EL1, and the other end of the data fan-out line DFL connected to the data line DL may also be made up of only the second conductive line EL2.

The first conductive line EL1 and the second conductive line EL2 may be insulated by a gate insulating film 200 interposed between them. However, the first conductive line EL1 and the second conductive line EL2 may be electrically connected to each other through a contact C to be described later.

Referring to FIG. 4 again, the data fan-out line DFL may include a first wiring section w1 extending in the x-axis direction, and a second wiring section w2 extending in the y-axis direction. In other words, the first conductive line EL1 and the second conductive line EL2 may include the first wiring section w1 extending in the x-axis direction and the second wiring section w2 extending in the y-axis direction.

At least a portion of the data fan-out line DFL may include a zigzag-shaped wiring. In other words, the first wiring section w1 and the second wiring section w2 may be repeatedly alternately disposed to form a zigzag-shaped wiring.

The lengths of the zigzag shapes of each data fan-out line DFL may be different from each other. This is caused by a difference in resistance due to a difference in distance of the data fan-out line DFL which connects the data driver 260 and the respective data lines DL. That is, the length of the zigzag-shaped wiring disposed in the center of the each data fan-out line DFL may be longer than zigzag shaped the wiring disposed outside of the each data fan-out line DFL.

The upper surface of the second conductive line EL2 in the first wiring section w1 may include an inclined surface. This will be described in detail with reference to FIG. 6. Referring to FIG. 6, the upper surface of the second conductive line EL2 may include an inclined surface which slopes from a reference surface SL at a certain angle. The inclined surface may be an inclined surface which slopes upward in a negative direction of the y-axis. In other words, the height from the upper surface of the first substrate 500 to the upper surface of the second conductive line EL2 may increase as it goes toward the negative direction of the y-axis. In this way, when the upper surface of the second conductive line EL2 has an inclined surface, it is possible to solve a problem in which the PR is unevenly applied when forming a particular layer by applying a PR onto the first substrate 500. That is, in the exemplary embodiment, the PR coating may proceed from the one end portion of the non-display area NDA in which the data driver 210 is disposed to a direction toward the display area DA, that is negative y-axis direction. In this case, when the inclined surface has an inclined surface upward in the negative direction of the y-axis, in other word when a thickness of the second conductive line EL2 increases according to decrease in y-coordinate, it is possible to prevent the PR from being unevenly applied by reducing the physical resistance which may occur when applying the PR.

The inclined surface may be formed on all or a portion of the first wiring section w1. Further, in another exemplary embodiment, the inclined surface may be formed only in the first wiring section w1 which is nearest to the side of the first substrate in which the PR is coated first, of the first wiring section w1. In other words, an inclined surface may be formed only on the first wiring section w1 which is nearest to the side of the first substrate 500 parallel to the first wiring section w1. This is because the physical resistance caused by the first wiring section w1 nearest to the side of the first substrate, of the first wiring section w1 is relatively greater than other first wiring section w1.

The data fan-out line DFL may include contacts C1, C2 for electrically connecting the first conductive line EL1 and the second conductive line EL2. The contacts C1, C2 may include a first contact C1 adjacent to the data driver 210, and a second contact C2 adjacent to the display area DA. Although FIG. 4 illustrates a case where the first contact C1 and the second contact C2 are disposed on one side and the other side of each data fan-out line DFL, this is an example, and in another embodiment, the number of the contacts and the specific location of the contacts may vary.

The contacts C1, C2 will be specifically described with reference to FIGS. 7a and 7b. Referring to FIGS. 7a and 7b, the first conductive line EL1 and the second conductive line EL2 insulated by the gate insulating film 200 may be electrically connected to each other by a connection electrode 160 which include connection electrodes 161 and 162. As described above, at least some of the data fan-out line DFL has the double wiring structure, but both end portions of the data fan-out line DFL may have a single wiring structure.

The first contact C1 may be disposed on one side of the data fan-out line DFL. Specifically, the first contact C1 may be disposed adjacent to the portion connected to the data driver 210. The first contact C1 may include a first sub-contact hole SC1 which exposes the first conductive line EL1 through a passivation film 600 and the gate insulating film 200 disposed on the first conductive line EL1, a second sub-contact hole SC2 which exposes the second conductive line EL2 through the passivation film 600, and a connection electrode 161.

The passivation film 600 may be disposed on the second conductive line EL2. The passivation film 600 may have the first sub-contact hole SC1 which exposes the first conductive line El1 and the second sub-contact hole SC2 which exposes the second conductive line EL2.

The first connection electrode 161 may be disposed on the passivation film 600. The first connection electrode 161 may electrically connect the first conductive line EL1 and the second conductive line EL2 through the first sub-contact hole SC1 and the second sub-contact hole SC2.

The first connection electrode 161 may be formed of substantially the same material as the pixel electrode PE. That is, the first connection electrode 161 may be simultaneously formed when forming the pixel electrode PE, but it is not limited thereto, and the first connection electrode 161 may also be formed through a separate process different from the pixel electrode PE.

Referring to FIG. 7b, a second contact C2 may include two second sub-contact holes SC2, and a first sub-contact hole SC1 and a second connection electrode 162 which are disposed between the two second sub-contact holes.

As described above, the first sub-contact hole SC1 exposes the first conductive line EL1 through the passivation film 600 disposed on the second conductive line EL2 and the gate insulating film 200 disposed on the second conductive line EL2, and the second sub-contact hole SC2 may expose the second conductive line EL2 through the passivation film 600.

A second connection electrode 162 may be disposed on the passivation film 600. The second connection electrode 162 may electrically connect the first conductive line EL1 and the second conductive line EL2 through the first sub-contact hole SC1 and the second sub-contact hole SC2.

In addition, a data fan-out line DFL disposed at the other end of the second contact C2 has a single wiring structure, and may be connected to the aforementioned data line DL.

Referring to FIG. 1 again, the non-display area NDA may include a plurality of gate fan-out sections GF1 to GF4. The gate fan-out sections GF1 to GF4 may be disposed on one side of the first substrate 500 adjacent to the data fan-out sections DF1 to DF5. As an example, the data fan-out sections DF1 to DF5 may be formed on a horizontal side outside of the display area DA, and the gate fan-out sections GF1 to GF4 may be formed on a vertical side outside of the display area DA. However, this is an example, and the positions of the data fan-out sections DF1 to DF5 and the gate fan-out sections GF1 to GF4 are not limited thereto. In another exemplary embodiment, the gate fan-out sections GF1 to GF4 may be disposed on the horizontal side outside, and the data fan-out sections DF1 to DF5 may be formed on the vertical side outside.

FIG. 1 illustrates a case of including the four gate fan-out sections GF1 to GF4, but this is an example, and the number of the data fan-out sections may vary depending on the number of the gate lines GL1 to GLj and the number of a gate driver (not shown).

A liquid crystal display device according to another embodiment of the present inventive concept will be described below. In the following example, the same configurations as the configurations described above are referred to as the same reference numerals, and the repeated description will be omitted or simplified.

Figure 8:
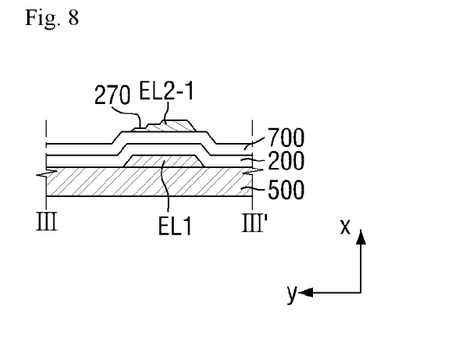
FIG. 8 is a cross-sectional view of a liquid crystal display device according to another embodiment of the present inventive concept.

FIG. 8 is a cross-sectional view of a liquid crystal display device according to another embodiment of the present inventive concept.

Referring to FIG. 8, a liquid crystal display device according to another embodiment of the present inventive concept is different from the embodiment of FIG. 6 in that an inclined surface of the second conductive line EL2_1 includes at least one stepped portion 270.

The upper surface of the second conductive line EL2_1 may include an inclined surface which slopes upward in a negative direction of the y-axis as described above. The inclined surface in the exemplary embodiment may be formed in a step shape. In other words, the inclined surface may be formed to include at least one stepped portion 270. Such a step shape may be achieved by the manufacturing method described later, but is not necessarily limited thereto.

FIG. 8 illustrates a case where the stepped portions 270 are two stages, but the number of the stepped portions 270 is limited thereto. That is, in another exemplary embodiment, the stepped portion 270 may be one stage or two or more stages.

That is, in the exemplary embodiment in which the second conductive line EL_2 includes the stepped portion 270, a height from the upper surface of the first substrate 500 to the upper surface of the second conductive line EL_2 may gradually increase as it goes toward negative direction of the y-axis.

Figure 9:
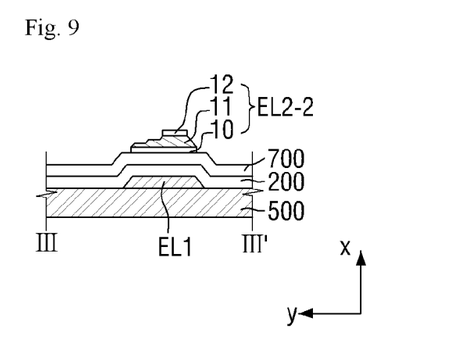
FIG. 9 is a cross-sectional view of a liquid crystal display device according to another embodiment of the present inventive concept.

FIG. 9 is a cross-sectional view of a liquid crystal display device according to another embodiment of the present inventive concept. Referring to FIG. 9, the liquid crystal display device according to another embodiment of the present inventive concept is different from the embodiment of FIG. 8 in that it includes a second conductive line EL2_2 made up of multi-films.

The second conductive line EL2_2 may be made up of a plurality of layers. FIG. 9 illustrates a case where the second conductive line EL2_2 is made up of triple films 10, 11, 12, but it is not limited thereto, and in another exemplary embodiment, the second conductive line may be made up of double films or made up of multi-films of triple films or more.

The first layer 10 and the third layer 12 of the second conductive line EL2_2 may contain molybdenum (Mo). The second layer 11 of the second conductive line EL2_2 may contain aluminum (Al). However, this is an example, and the material of the second conductive line EL2_2 is not limited thereto.

When the second conductive lines EL2_2 has a triple-film structure, the aforementioned data lines DL, SE, DE, 150 may have a triple-film structure, and in this case, the second conductive line EL2_2 and the data wirings DL, SE, DE, 150 may be simultaneously formed in the same process.

A method of manufacturing a liquid crystal display device according to an embodiment of the present inventive concept will be described below. Some of the configurations described below are the same as the configurations of the liquid crystal display device according to some embodiments of the present inventive concept, and in order to avoid the repeated description, description of some configurations may be omitted.

FIGS. 10 to 16 are cross-sectional views for explaining a method of manufacturing a liquid crystal display device according to an embodiment of the present inventive concept.

Referring to FIGS. 10 to 16, the method of manufacturing a liquid crystal display device according to an embodiment of the present inventive concept includes preparing a first substrate 500 which includes a first conductive line EL1, a gate insulating film 200 disposed on the first conductive line EL1, a semiconductor pattern layer 700 disposed on the gate insulating film 200, and a second conductive layer 800 disposed on the semiconductor pattern layer 700; forming a first photosensitive film pattern PR1 having a first height d1 on the second conductive layer 800, an upper surface of the first photosensitive film pattern including an inclined surface 370 sloping upward toward a negative direction of an y-axis; forming a second conductive line EL2 by etching the second conductive layer 800 using the first photosensitive film pattern PR1 as a mask; forming a second photosensitive film pattern PR2 which exposes a portion of the second conductive line EL2 and has a second height d2 by removing a portion of the first photosensitive film layer pattern PR1; forming a first stepped portion 15 on the second conductive line EL2 by etching a portion of the second conductive line EL2 using the second photosensitive film pattern PR2 as a mask; forming a third photosensitive film pattern PR3 which exposes a portion of the second conductive line EL2 and has a third height d3, by removing a portion of the second photosensitive film pattern PR2; and forming a second stepped portion 16 on the second conductive line EL2, by etching a portion of the second conductive line EL2 using the third photosensitive film pattern PR3 as a mask.

Figure 10:
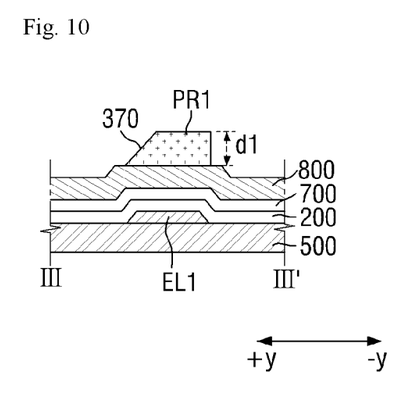
FIGS. 10, 11, 12, 13, 14, 15 and 16 are cross-sectional views for explaining a method of manufacturing a liquid crystal display device according to an embodiment of the present inventive concept.

First, referring to FIG. 10, a first conductive line EL1 is formed on the first substrate 500. The first conductive line EL1 may be formed of a gate wiring conductor. The first conductive line EL1 may be formed by methods, such as a chemical vapor deposition, a plasma chemical vapor deposition, a physical vapor deposition and sputtering.

Subsequently, a gate insulating film 200 is formed on the first conductive line EL1. The gate insulating film 200 may be formed by a chemical vapor deposition or a plasma enhanced chemical vapor deposition Subsequently, a semiconductor pattern layer 700 is formed on the gate insulating film 200. The semiconductor pattern layer 700 may be formed by a chemical vapor deposition or plasma enhanced chemical vapor deposition A second conductive layer 800 may be formed on the semiconductor pattern layer 700. The second conductive layer 800 may be formed of a data wiring conductor. In other words, the second conductive layer may be formed of substantially the same material as the above-described data wirings DL, SE, DE, 150 and may be simultaneously formed in the same process.

The second conductive layer 800 may have a single layer or a multilayer formed by lamination of a more than two films.

A first photosensitive film pattern PR1 may be disposed on the second conductive layer 800. The upper surface of the first photosensitive film pattern PR1 may include an inclined surface which slopes upward in the negative direction of the y-axis. The first photosensitive film pattern PR1 may have a first height d1. Here, the first height d1 refers a height in which the distance from the lower surface to the upper surface of the first photosensitive film pattern PR1 is maximum.

The height of the first photosensitive film pattern PR1 may increase gradually or may have steps which rises along the negative direction of the y-axis.

Figure 11:
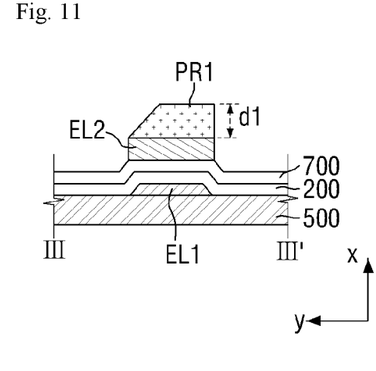
Figure 12:
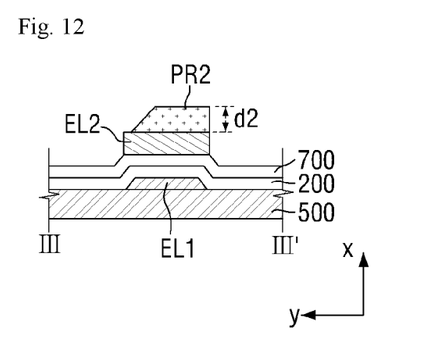

Subsequently, referring to FIG. 11, the second conductive layer 800 is etched using the first photosensitive film pattern PR1 as an etching mask. The second conductive layer 800 may be etched to form a second conductive line EL2. The second conductive layer 800 may be wet-etched, but the etching method is not limited thereto, the second conductive layer 800 may be dry-etched, Subsequently, referring to FIG. 12, a second photosensitive film pattern PR2 is formed by removing a portion of the first photosensitive film pattern PR1. The second photosensitive film pattern PR2 may have a second height d2 smaller than the first height d1. Also, as the height decreases, a portion of the second conductive line EL2 superimposed with the lower end of the inclined surface of the first photosensitive film pattern PR1 may be exposed.

Figure 13:
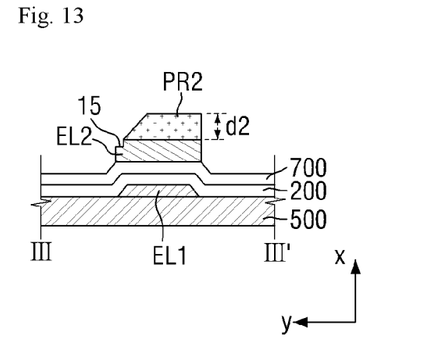

Subsequently, referring to FIG. 13, a first stepped portion 15 is formed on the second conductive line EL2, by etching a portion of the second conductive line EL2 using the second photosensitive film pattern PR2 as a mask. Forming the first stepped portion by etching a portion of the second conductive line EL2 may include dry-etching the second conductive line. That is, in order to form the first stepped portion 15 on the second conductive line EL2 without etching the whole second conductive line EL2 exposed by the second photosensitive film pattern PR2, the dry-etching method may be applied.

Figure 14:
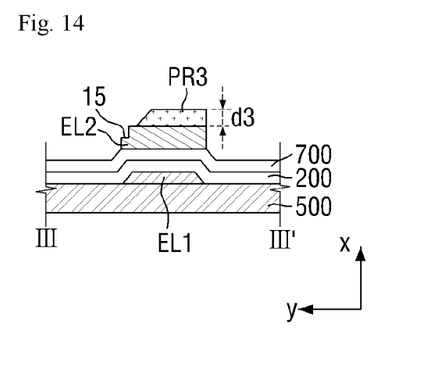

Subsequently, referring to FIG. 14, a third photosensitive film pattern PR3 is formed by removing a portion of the second photosensitive film pattern PR2. The third photosensitive film pattern PR3 may have a third height d32 smaller than the second height d. However, the upper surface of the third photosensitive film pattern PR3 may include an inclined surface, like the first photosensitive film pattern PR1 and the second photosensitive film pattern PR2. Further, as the height of the second photosensitive film pattern PR2 generally decreases, a portion of the second conductive line EL2 at the edge may be exposed.

Figure 15:
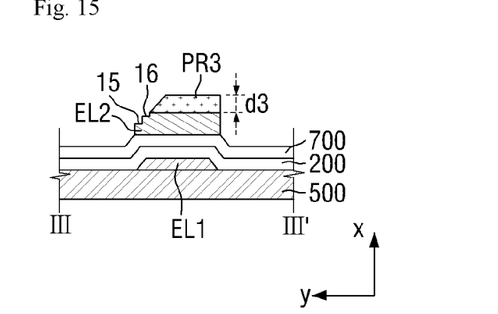

Subsequently, referring to FIG. 15, a portion of the second conductive line EL2 is etched using the third photosensitive film pattern PR3 as a mask. Etching a portion of the second conductive line EL2 using the third photosensitive film pattern PR3 as a mask may include dry-etching the second conductive line EL2. A second stepped portion 16 may be formed by etching the second conductive line EL2 using the third photosensitive film pattern PR3 as a mask. However, even in this case, it is necessary to adjust the degree of etching so that the first stepped portion 15 remains without being completely etched, and the dry-etching method may be adopted to this end.

Figure 16:
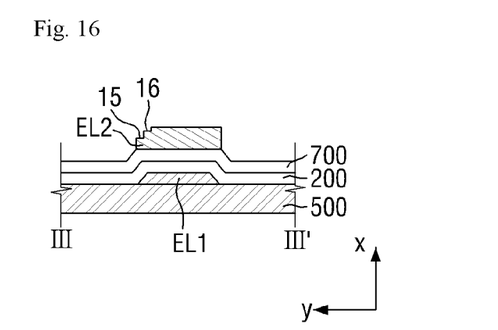

Referring to FIG. 16, a third photosensitive film pattern PR3 is stripped. Although a case where the stepped portions are two stages was described above as an example, the scope of the present inventive concept is not limited thereto. In other words, the method of manufacturing a liquid crystal display device according to an embodiment of the present inventive concept may include a case where the stepped portion is one stage or three or more stages, as well as a case where the stepped portions are two stages. In this case, some of forming the stepped portion may be omitted or added.

While the embodiments of the present inventive concept have been described with reference to the accompanying drawings, it will be understood by a person having the ordinary knowledge in the art to which this inventive concept belongs that the present inventive concept may be embodied in other specific forms, without changing the technical spirit and essential characteristics of the present inventive concept. Therefore, the embodiments described above should be understood in a descriptive sense only and not for purposes of limitation.

What is claimed is:

1. A liquid crystal display device comprising:
   a first substrate which includes a display area and a non-display area surrounding the display area; and
   a plurality of data fan-out lines which is disposed in the non-display area and the plurality of data fan-out lines including a first conductive line and a second conductive line which overlaps the first conductive line,
   wherein at least a portion of the second conductive line includes a first wiring section extending in a first direction, and a second wiring section extending in a direction substantially perpendicular to the first direction, and
   wherein an upper surface of the second conductive line in the first wiring section includes an inclined surface which slopes upward toward an opposite direction of the first direction.

2. The liquid crystal display device of claim 1, further comprising:
   a gate insulating film which is disposed on the first conductive line to insulate the first conductive line and the second conductive line.

3. The liquid crystal display device of claim 1, wherein a central portion of the data fan-out line includes a double wiring structure which includes the first conductive line and the second conductive line, and both ends of the data fan-out line includes a single wiring structure having the first conductive line or the second conductive line.

4. The liquid crystal display device of claim 3, wherein the data fan-out line is connected to a data line disposed in the display area, and one end of the data fan-out line connected to the data line includes of only the second conductive line.

5. The liquid crystal display device of claim 4, wherein the other end of the data fan-out line only includes the first conductive line.

6. The liquid crystal display device of claim 1, wherein the inclined surface is formed only on the first wiring section which is nearest to the side of the first substrate parallel to the first wiring section.

7. The liquid crystal display device of claim 1, wherein the data fan-outline comprises a contact which electrically connects the first conductive line and the second conductive line.

8. The liquid crystal display device of claim 7, further comprising:
- a first gate insulating film disposed on the conductive line, and a passivation film disposed on the second conductive line,
- wherein the contact comprises a first sub-contact hole which exposes the first conductive line through the passivation film and the gate insulating film, and a second sub-contact hole which exposes the second conductive line through the passivation film.

9. The liquid crystal display device of claim 8, wherein the contact further comprises a first connection electrode which electrically connects the first conductive line and the second conductive line through the first sub-contact hole and the second sub-contact hole.

10. The liquid crystal display device of claim 8, wherein the contact comprises a first contact adjacent to one side of the first substrate, and a second contact adjacent to one side of the display area.

11. The liquid crystal display device of claim 10, wherein the second contact comprises two second sub-contact holes and one first sub-contact hole.

12. The liquid crystal display device of claim 1, wherein the inclined surface comprises at least two flight of stairs.

13. The liquid crystal display device of claim 1, wherein the second conductive line has a multi-film structure having a plurality of layers.

* * * * *